(12) United States Patent
Hargreaves et al.

(10) Patent No.: US 7,046,003 B2
(45) Date of Patent: May 16, 2006

(54) REDUCED-TIME VARIABLE RATE EXCITATION PULSES FOR RAPID MRI

(75) Inventors: Brian A. Hargreaves, Menlo Park, CA (US); Charles H. Cunningham, San Francisco, CA (US); Steven M. Conolly, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/945,670

(22) Filed: Sep. 20, 2004

(65) Prior Publication Data

US 2006/0061358 A1    Mar. 23, 2006

(51) Int. Cl.
G01V 3/00    (2006.01)

(52) U.S. Cl. .......................... 324/307; 324/309
(58) Field of Classification Search ................ 324/307, 324/309, 300, 318, 319, 322; 600/408, 410
See application file for complete search history.

(56) References Cited

U.S. PATENT DOCUMENTS

| | | | |
|---|---|---|---|
| 5,345,176 A * | 9/1994 | LeRoux et al. ............. | 324/309 |
| 5,560,360 A * | 10/1996 | Filler et al. ................. | 600/408 |
| 6,452,387 B1 * | 9/2002 | Hargreaves et al. ........ | 324/300 |
| 6,483,305 B1 * | 11/2002 | Miyamoto ................... | 324/307 |
| 6,794,867 B1 * | 9/2004 | Block et al. ................. | 324/307 |

OTHER PUBLICATIONS

Conolly, et al., "*A Reduced Power Selective Adiabatic Spin-Echo Pulse Sequence*," Magnetic Resonance in Medicine, vol. 18, pp 28-38, 1991.
Conolly, et al., "*Variable-Rate Selective Excitation,*," Magnetic Resonance in Medicine, vol. 18, pp 28-38, 1991.
Hargreaves et al., "*Variable-Rate Selective Excitation for Rapid MRI Sequences*," Magnetic Resonance in Medicine, vol. 52, pp 590-597, 2004.
Hargreaves et al., "*Fat-Supressed Steady State Free Precession Imaging Using Phase Detection*," Magnetic Resonance in Medicine, vol. 50, pp 210-213, 2003.

* cited by examiner

Primary Examiner—Brij B. Shrivastav
(74) Attorney, Agent, or Firm—Beyer Weaver & Thomas LLP

(57) ABSTRACT

A pulse sequence for use in steady state free precession (SSFP) imaging sequences includes a RF pulse and a time-varying gradient pulse based on a conventional design algorithm such as the Shinnar-LeRoux (SLR) pulse design algorithm and in which amplitude of the RF pulse and gradient pulse are increased while pulse time is decreased thereby reducing imaging time and improving slab profiles.

19 Claims, 8 Drawing Sheets

REDUCED-TIME VARIABLE RATE EXCITATION PULSES FOR RAPID MRI

GOVERNMENT RIGHTS

The U.S. government has rights in the disclosed invention pursuant to NIH grants to Stanford University including NIH-HL39297, NIH-HL56394, NIH-AR46904, NIH-CA50948, NIH-EB000346, and NIH-000777-01.

BACKGROUND OF THE INVENTION

This invention relates generally to magnetic resonance imaging (MRI), and more particularly the invention relates to steady state free precession (SSFP) imaging.

Magnetic resonance imaging (MRI) provides excellent soft tissue contrast with arbitrary scan-volume orientations, thus making MRI an extremely useful medical imaging modality. However, in many applications, MRI is limited by long scan times, limited spatial resolution, and contrast between lipid-based tissue and water-based tissue. Recent advances in gradient amplifier technology have enabled the use of fully-refocused steady-state free precession (SSFP) imaging methods. SSFP imaging is a very fast method that can provide good tissue contrast and high resolution. A number of commercial implementations of SSFP are available, all of which are conceptually identical.

As illustrated in FIG. 1, a refocused SSFP sequence consists of a single RF excitation which is repeated periodically. All gradients used for slice selection or imaging are fully rewound over each repetitive time, TR. In the steady-state, the magnetization at points a and d is the same. Magnetization is tipped about the x-axis through an angle α. Between excitations, the magnetization undergoes a precession by an angle $\theta=2\pi\Delta fTR$ about the z-axis, where f is the tissue off-resonance, and also experiences both T1 and T2 relaxation.

During the sequence each spin is affected by RF pulses, relaxation and free precession. The steady-state magnetization for SSFP is a function of the sequence parameters flip angle (a), repetition time (TR) and echo time (TE) as well as the tissue parameters T1, T2, and off-resonant frequency $\Delta f$.

Balanced SSFP imaging sequences require short repetition times to avoid off resonance artifacts. The use of slab-selective excitations is common, as this can improve imaging speed by limiting the field of view. However, the necessarily short duration excitations have poor slab profiles. This results in unusable slices at the slice edge due to significant flip angle variations or aliasing in the slab direction.

SUMMARY OF THE INVENTION

The present invention provides a SSFP imaging sequence using short duration RF excitation pulses and time varying gradient waveforms to achieve enhanced imaging slab profiles and more rapid imaging.

More particularly, amplitudes of the RF excitation and gradients are increased in order to reduce and minimize the duration of excitation pulses and improve image slab profiles. Design of the pulses consider gradient slew rates and specific absorbed radiation (SAR) limits.

In designing the RF pulses, known techniques such as the Shinnar-LeRoux (SLR) pulse design algorithm are utilized to design a conventional pulse with an RF pulse time× bandwidth (TB) product as a measure of the ratio of slab width to transition width and a measure of profile sharpness. Other known pulse design techniques can be employed, such as simulated annealing or varying phase techniques. A constant gradient waveform amplitude for the initial RF pulse and slab thickness is then calculated.

The gradient waveform and RF pulse are compressed together in time so that either the RF pulse or the gradient is always at maximum amplitude. Where slew rate is violated, the gradient and RF waveform are expanded together in time while maintaining the same excitation k-space RF energy deposition. This step must be applied recursively since expansions at one point can effect slew rate elsewhere in the waveform.

The resulting gradient waveform is low pass filtered to reduce the likelihood of exceeding gradient amplifier bandwidths, and the RF waveform is correspondingly altered. The resulting RF and gradient pulse pair reduces imaging time and improves slab profiles.

The invention and objects and features thereof will be more readily apparent from the following detailed description and appended claims when taken with the drawings.

DETAILED DESCRIPTION

Figure 1:
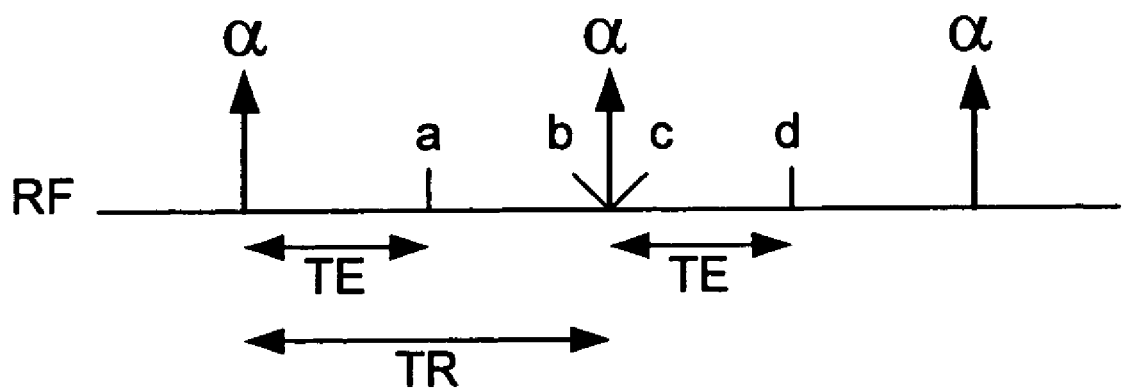
FIG. 1 illustrates a SSFP pulse sequence.

The invention provides a RF pulse and time varying gradient pulse pair which reduces pulse duration and repetition times with improved imaged slab profiles in SSFP imaging sequences.

We addressed the design of the selective excitation pulses using a k-space formalism that views excitation from a frequency-domain paradigm: the gradient waveform describes a trajectory through excitation k-space, while the RF waveform deposits energy at different spatial frequencies. The Shinnar-Le Roux (SLR) pulse design algorithm uses a more accurate mapping between the RF waveform and the excitation profile. SLR pulse design is very powerful, as it employs existing digital filter design principles for selective RF pulse design. For example, with the use of SLR pulse design, it is possible to design the optimal equi-ripple profile for a given time×bandwidth product (TB). We use TB as a measure of slice profile sharpness, since TB is proportional to the ratio of the slice width (full-width at half-maximum (FWHM)) to the transition width of the profile. Though we chose to use SLR pulse design, the reduced-time VERSE technique presented here will work with other RF pulse design techniques, such as simulated annealing or varying phase approaches.

Variable-rate selective excitation (VERSE) pulses can use a time-varying gradient to traverse excitation k-space at different rates. See Conolly et al. "Variable—rate selective excitation," J. Magn. Reson. 1988; 78:440–4589; Conolly et al. "A reduced power selective adiabatic spin-echo pulse sequence," Magn Reson Med 1991; 18:28–38. The primary application of VERSE has been to reduce the gradient waveform in regions of high RF amplitude, which in turn reduces RF energy. With this invention, our goal is to use VERSE to instead minimize the duration of excitation pulses by increasing both RF and gradient amplitudes as much as practical limits would allow. Following is a review the continuous time VERSE principle.

A "standard" RF pulse, b(t), is played with a constant selection gradient of amplitude g. To achieve the same excitation profile, a VERSE RF pulse $b_v(t)$ and the corresponding time-varying gradient $g_v(t)$ can be defined as follows:

$$b_v(t) = b(\tau(t))\dot\tau(t) \quad (1)$$

$$g_v(t) = g\dot\tau(t) \quad (2)$$

where b (t) is the original RF waveform, g is the amplitude of the constant gradient waveform, and $b_v(t)$ and $g_v(t)$ are the VERSE RF and gradient waveforms respectively.

The standard (constant-gradient) RF waveform is defined for $t \in [0,T]$, while the VERSE RF and gradient waveforms are defined for $t \in [0, T_v]$. The transformation to VERSE pulses is defined by the selection of the "time dilation function," $\tau(t)$, which has the same units of time as t, and end-point constraints $\tau(0)=0$ and $\tau(T_v)=T$.

The design of minimum-time VERSE pulses requires selection of $\tau(t)$ for $t \in [0, T_v]$, such that $T_v$ is minimized under the following constraints:

1. $\tau(t)$ is monotonically increasing from $\tau(0)=0$ to $\tau(T_v)=T$.

2. $|b_v(t)| \leq B_{max}$.

3. $|g_v(t)| \leq G_{max}$.

4. $\left|\dfrac{dg_v(t)}{dt}\right| \leq S_{max}$.

where $B_{max}$, $G_{max}$, and $S_{max}$ are respectively the maximum RF amplitude, maximum gradient amplitude, and maximum time-rate-of-change of the gradient. It is assumed that the gradient waveform is always non-negative.

An iterative VERSE design technique and approximation for the time-optimal solution was previously employed for the design of 2D pulses. However, there is no known closed-form solution for this selection of $\tau(t)$. Following is a description of a recursive procedure that numerically evaluates VERSE pulses that closely approximate the above conditions.

In this section we describe the pulse design procedure used in the current study. We simulate excitation pulses for steady-state sequences, and validate these pulses in phantoms and in vivo images. Finally, we explore the effect of slice profile sharpness on the duration and RF power of the excitation pulses.

In the design procedure, we begin with standard linear-phase RF pulses designed with the use of SLR pulse design. We define the RF pulse time×bandwidth product (TB) as the duration of the standard RF pulse multiplied by the half-maximum bandwidth of the excitation profile. We note that TB is proportional to the ratio of slab width to transition width, and is a useful measure of profile sharpness. In all cases, we design a slab width of 40 mm to represent a narrow, practical slab width, since wider slabs will result in even shorter-duration pulses for a given TB.

Each RF pulse is then converted to the time-optimal VERSE RF/gradient pair by means of a recursive design algorithm, as follows:

1. The RF waveform is uniformly compressed in time until the maximum RF amplitude is reached.
2. The constant gradient waveform amplitude (g) for the initial RF pulse and given slab thickness is calculated.
3. Ignoring the gradient slew rate limit, the gradient waveform and RF are compressed together in time so that either the RF or the gradient are always at the maximum amplitude.
4. The end-points of the gradient and RF are set to zero.
5. At each point in the gradient where the slew rate is violated, the gradient and RF waveforms are expanded together in time to eliminate the slew-rate violation, while maintaining the same excitation k-space RF deposition. This step is applied recursively, as expanding one time point often results in a slew violation elsewhere in the waveform.
6. Both RF and gradient waveforms are re-sampled with the use of a uniform sampling rate so that the waveforms can be played on a real system.
7. The resulting gradient waveform is low-pass-filtered to a bandwidth of 50 kHz to reduce the likelihood of exceeding gradient amplifier bandwidth, and the RF waveform is correspondingly altered.

Figure 2:
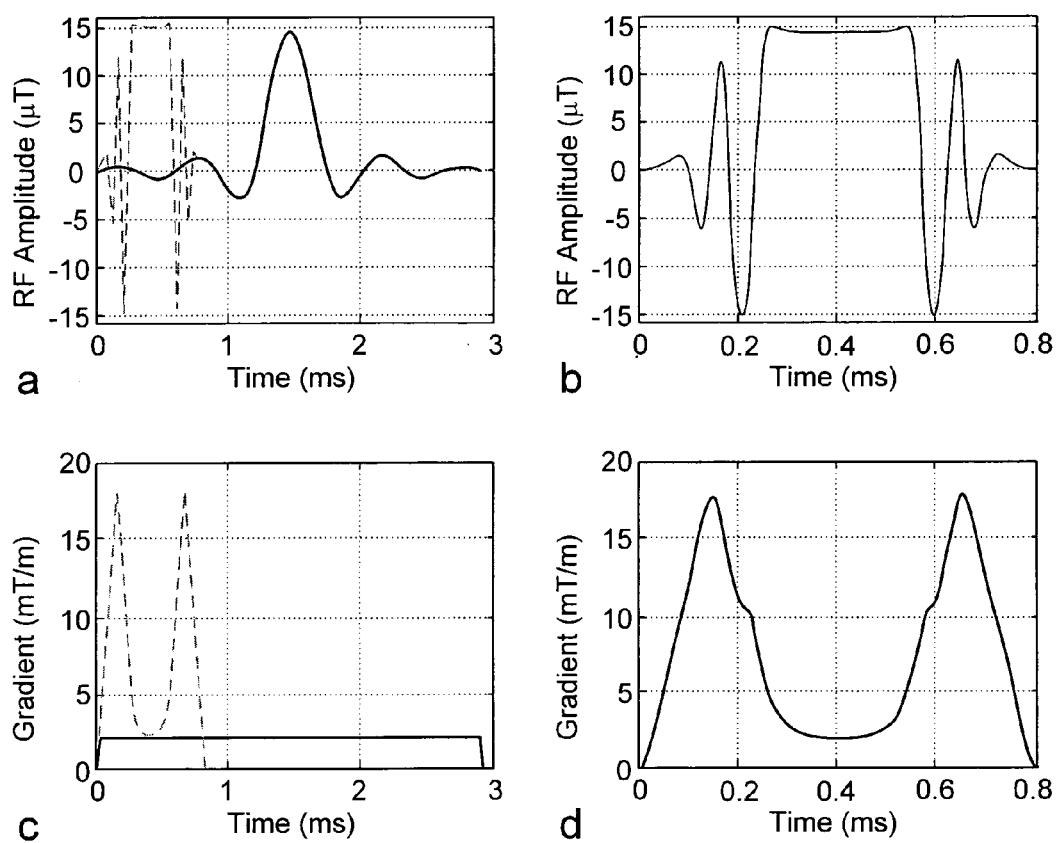
FIGS. 2a, 2c illustrate standard slab-selective RF and gradient waveforms for SSFP applications.
FIGS. 2b and 2d illustrate a corresponding variable rate selective excitation RF and gradient pulse pair in accordance with an embodiment of the invention.

The intent of the above algorithm is to achieve a near time-optimal VERSE RF/gradient pulse pair that achieves a given slab profile. As an example of this design process, FIG. 2(a and c) shows the "standard" slab-selective RF/gradient waveforms (with a constant gradient wave-form during the RF pulse) corresponding to steps 1 and 2 above. The minimum-time VERSE RF/gradient pair is shown in FIG. 2(b and d). A significant time reduction (from 2.9 ms to 0.8 ms) is obtained by the use of the reduced-time VERSE design. The VERSE excitation is very close to one of the limits (maximum RF or gradient amplitude or maximum gradient slew-rate) for the entire duration of the pulse.

As an initial validation, we simulate the slab profiles of all of the reduced-time excitation pulse pairs. As these excitations are intended to be applied to balanced SSFP imaging sequences, the goal is to simulate the steady-state excitation profile. We used a Bloch equation simulation that calculates the precession and decay matrices using the RF and gradient waveforms for each of a set of resonant frequency and spatial offsets. At each spatial offset, a resulting matrix equation is solved such that the magnetization is the same from one sequence repetition to the next, as in Scheffler et al. MRM 2001; 45: 1075–1080. This steady-state Bloch simulation was coded in Matlab 6.5 (The Mathworks, Natick, Mass.).

For a 40-mm slab thickness, we designed 60°-flip-angle RF pulses with TB=2, TB=5 and TB=10, and used the minimum-time VERSE algorithm to shorten the latter two pulses. The design parameters used were a maximum gradient amplitude of 40 mT/m, a maximum gradient slewrate of 150 T/m/s, and a maximum RF amplitude of 15 μT. Both the RF and gradient waveforms were sampled at 4-μs intervals. The spatial profiles of each pulse pair were generated by means of the steady-state Bloch simulation described above, assuming a sequence TR of 5.0 ms, and all gradients were fully refocused over the sequence repetition. All of the parameters described here apply in the following description, unless otherwise noted.

Compared with a standard excitation (constant gradient), VERSE pulses will have different sensitivity to resonant frequency offsets, as well as to timing delays between the RF and gradient waveforms. Both of these effects will distort the VERSE profile more than they would distort the profile of a standard waveform. However, due to increased gradient amplitude, the minimum-time VERSE profile may be shifted less due to resonant offsets than that of a standard excitation. In balanced SSFP sequences, there is an implicit assumption that the resonant frequency variation over the volume of interest is small. However, it is useful to examine the effect of off-resonance on the slice profile. We repeated the simulation to generate the steady-state slice profile for the TB=10 pulse pair using the Bloch simulation at resonant offsets of 0 Hz, 200 Hz, 400 Hz, and 600 Hz. We also repeated the simulation whereby an intentional delay of 0, 4, 8, and 12 μs is applied between the RF waveform and the gradient waveform.

We verified the simulations of slice profile using a 3D balanced SSFP sequence with 64 slices, 2-mm slice thickness, TR=5 ms, and a 60° flip angle. The TB=2, TB=5 and TB=10 excitations were individually tested. The scans were performed with a standard quadrature transmit/receive coil on a 1.5 T G.E. LX scanner (G.E. Medical Systems, Waukesha, Wis.) with CV/i gradients (40 mT/mmaximum amplitude and 150 T/m/s maximum slew rate). We used a cylindrical phantom of water doped with MnCl, T1/T2=350/300 ms.

As discussed above, the slab profile was designed to be 40 mm. Thus the 64-slice 3D sequence sampled well outside the excited slab. The amplitude for each slice was taken as the sum of pixel magnitudes over the entire slice. A plot of slice amplitude as a function of slice position was made for each of the three excitations.

The same sequence used for phantom validation was combined with cardiac gating and a breath-hold for in vivo validation of the slab profile for the TB=10 excitation. Other parameters included 2×2 mm in-plane resolution, and 30 sections of 3-mm thickness. The resulting slab direction FOV of 9 cm was well beyond the width of the slab, so that the slab profile could be studied. An axial slab was selected slightly above the heart, and a breath-hold of 30 heartbeats was used for image acquisition. A 3D reconstruction of this image was made for visualization of the slice profile.

We have verified a few specific VERSE excitation pulses. However, for general design purposes, it is useful to examine the minimum-time VERSE excitation duration and RF energy as the design parameters are varied. We repeated the design for flip angles of 30°, 60°, and 90°, and TB values between 2 and 20. The same RF and gradient amplitudes listed above were used for this design. The duration of the standard and VERSE excitations, and the RF energy of each VERSE RF waveform were measured for each different case.

Since an imaging scan uses many RF pulses, the RF power deposition in a patient, also called specific absorption rate (SAR), is proportional to the RF energy in each pulse. Compression of excitation pulses in time generally increases RF energy (or RF power deposition in the patient). Thus minimum-time VERSE pulses will result in a relatively high RF energy for a given profile. RF power deposition limits vary regionally and with the type of transmit coil used. In commercial systems, methods of calculating power deposition are based on experiments. Herein, we compare the RF energy of each pulse to that of a nonselective "reference pulse" that has a constant RF amplitude of 14.68 μT for 400 μs, and produces a flip angle of 90°. Using the assumption of a quadrature head coil, and a spherical (0.1 m radius) approximation for the head, this pulse deposits an average SAR of 1.4 W/kg (with TR=5 ms). Our scanner's internal SAR calculation gives 2.2 W/kg for the body coil for a 70-kg patient under the same conditions.

Figure 3:
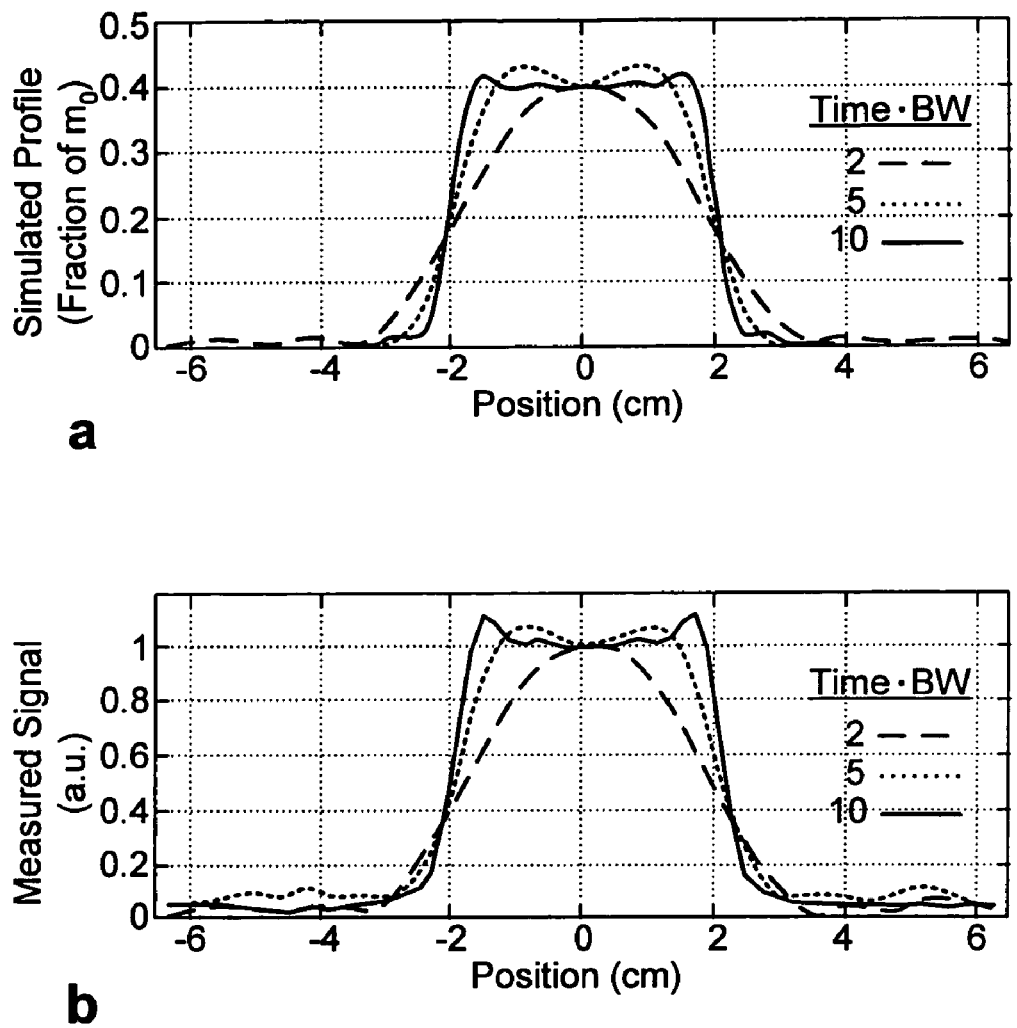
FIGS. 3a, 3b illustrate simulated and measured steady-state slab profiles for different values of TB using variable rate selective excitation RF in accordance with the invention.

A sample of a standard excitation and minimum-time VERSE RF/gradient waveform pair is shown in FIGS. 2a, 2b. In FIG. 3, we compare slab profiles for TB=2, TB=5, and TB=10 excitations. Both the simulated and experimentally-measured profiles are shown for all three pulses. There is good agreement between the simulations and the phantom measurements. In particular, the TB=10 pulse produces a very sharp yet flat slab profile.

Figure 4:
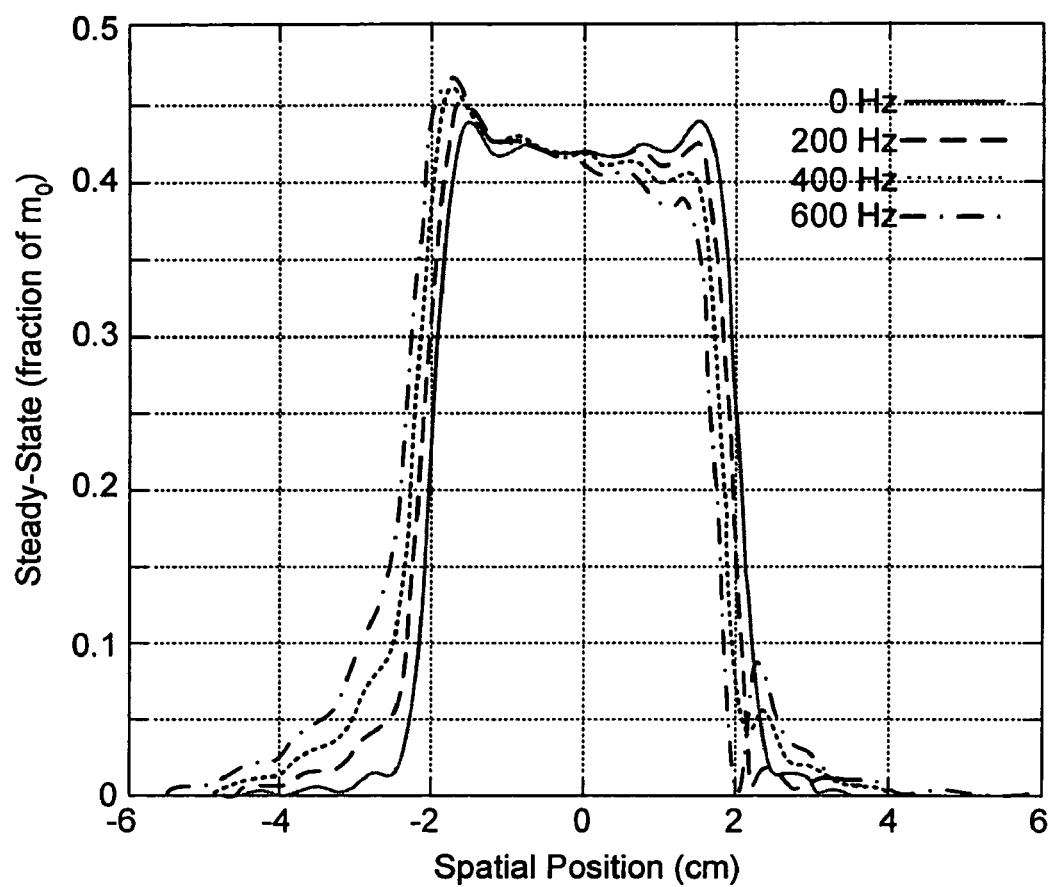
FIG. 4. illustrates variable rate selective excitation profiles for different resonant frequency offsets.

The simulated profile of the TB=10 excitation at different resonant frequency offsets is shown in FIG. 4 for resonant offsets of $OH_z$, $200H_z$, $400H_z$ and $600H_z$. The slab profile itself is fairly immune to off-resonance. However, there is increased excitation out-of-slab as the resonant frequency offset increases. A sign change in the resonant frequency offset simply flips the slab profile about the origin, as would be expected. In balanced SSFP imaging sequences, a good shim is assumed, so the frequency offsets should not be nearly as large as tested here.

Figure 5:
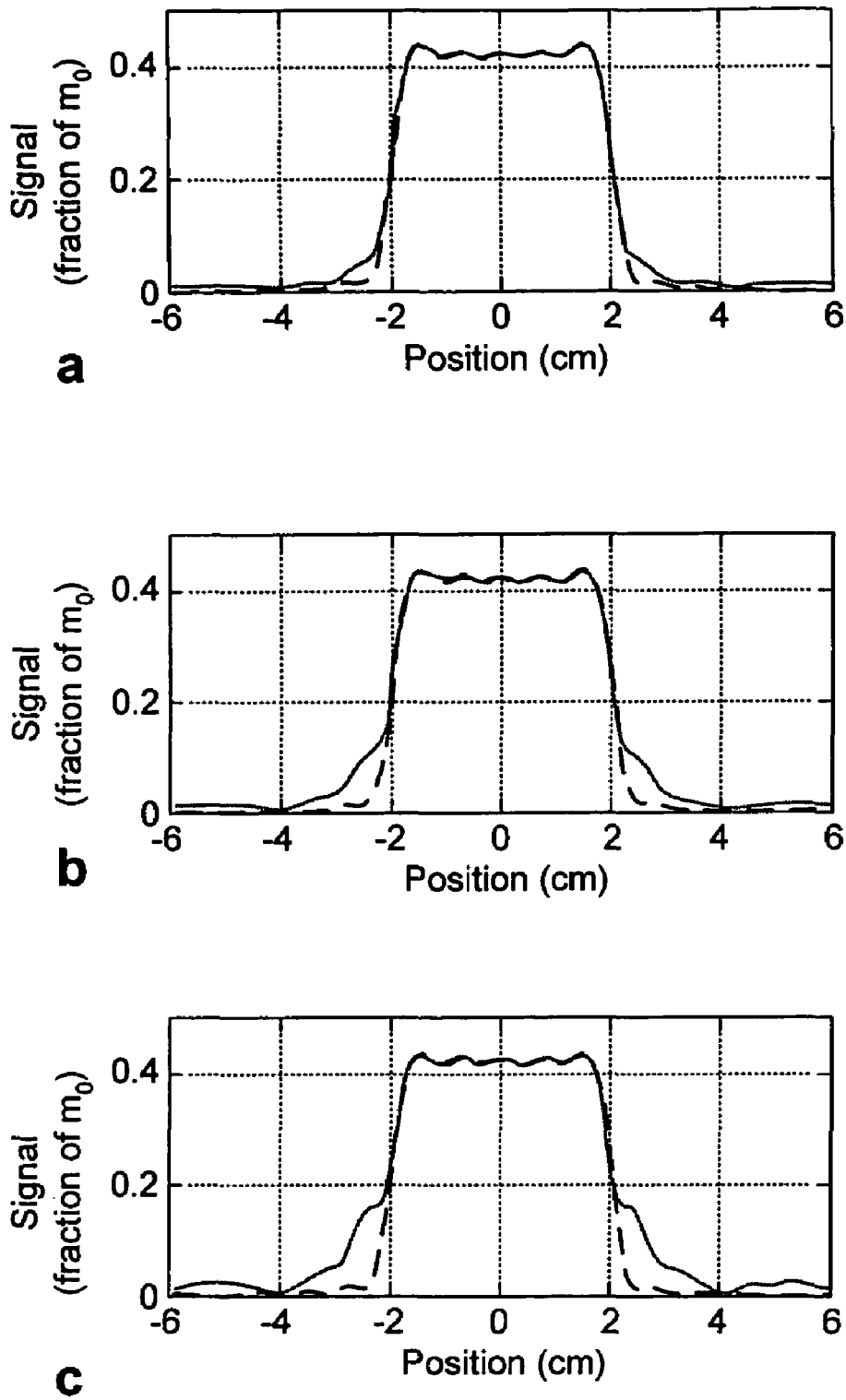
FIGS. 5a–5c. illustrate imaging profiles for different timing mismatches.

FIG. 5 shows the simulated profile of the TB=10 excitation as the delay between RF and gradient waveforms is changed for mismatches of 4 μs, 8 μs and 12 μs For relative delays within 4 μs, the effect on the slab profile is negligible. For symmetric waveforms, as used here, a sign change in the relative delay does not affect the magnitude profile (not shown). Careful tuning of waveform delays allows reduction of inter-waveform delays to within 4 μs.

Figure 6:
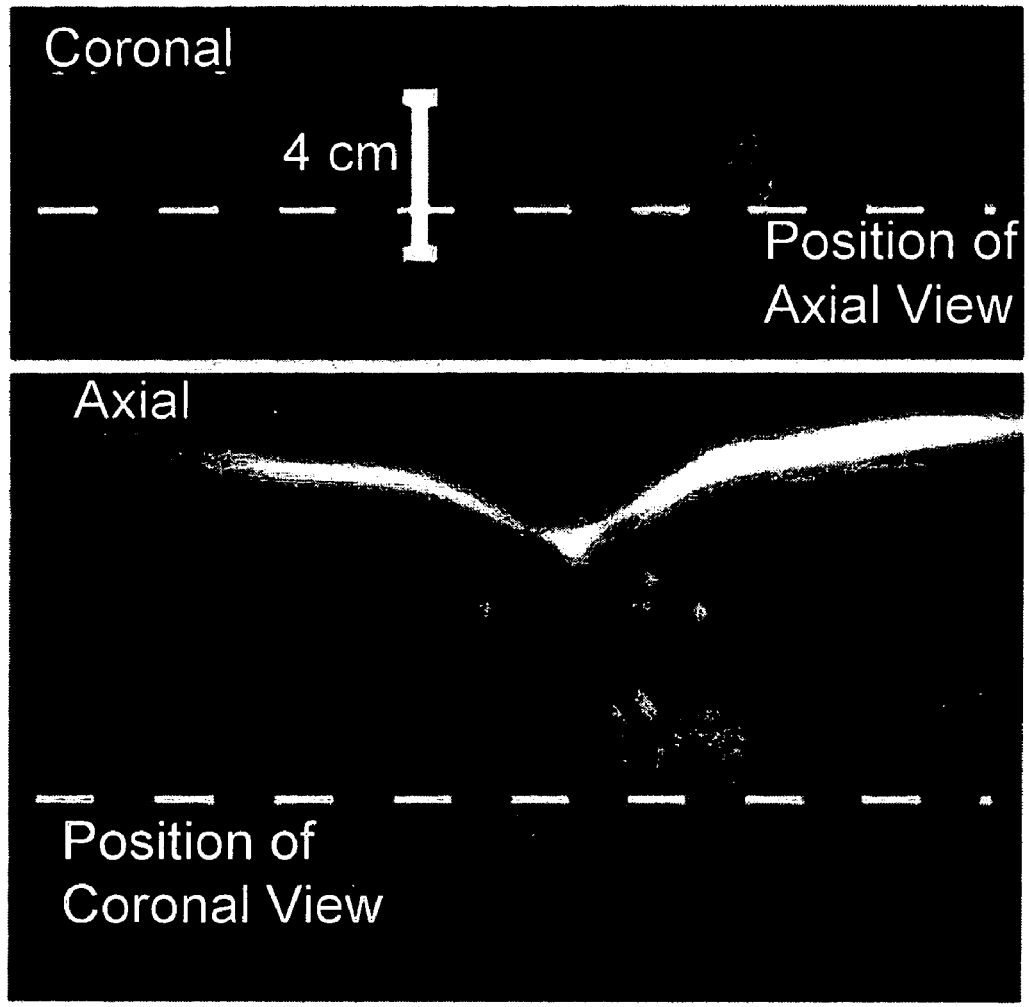
FIG. 6. illustrates a sample image showing uniform contrast across the slab and negligible excitation outside of the slab using variable rate selective excitation in accordance with the invention.

A sample image showing the profile of a coronal (top) and an axial slab (bottom) using a TB=10 VERSE excitation in vivo is shown in FIG. 6. The contrast is uniform across the slab, and the excitation outside the slab is negligible. This validates the objective of the excitation pulse: the through-slab FOV can be reduced without aliasing.

The duration of standard and minimum-time VERSE excitations as a function of TB is shown in FIG. 7a. VERSE pulses have a significantly shorter duration than standard pulses. The duration of standard pulses increases roughly linearly with both flip angle and TB (FIG. 7b). However, the incremental increase in VERSE pulse duration with the flip angle or TB drops as either the flip angle or the TB is increased. This means that VERSE pulses are particularly useful at moderate to high flip angles, or for high-TB excitations.

FIG. 7c shows the relative RF energy of 60° minimum-time VERSE excitations compared with that of a "reference" pulse (400 μs, 90°). The RF energy is increased with respect to a nonselective pulse by a factor of almost 2 in the case of a 90° pulse. However, in balanced SSFP, it is typical to use lower flip angles, such as 30–60°. The slope of incremental RF energy with respect to TB drops as TB increases.

We have described a method to design reduced-time excitation pulses that achieve sharp slab profiles for rapid imaging sequences. We validated the pulses in simulations, phantom tests, and in vivo images. In addition, we analyzed the sensitivity of the pulses to resonant frequency offsets and timing mismatches. Finally, we varied the profile sharpness in the design to observe its effect on pulse duration and RF power.

Our design method begins with SLR pulse design. The VERSE technique is used to distort the RF waveform to match a time-varying slab-select gradient waveform. Our invention attempts to find the minimum-duration RF and gradient waveforms subject to constraints of maximum RF amplitude, maximum gradient amplitude, and maximum gradient slew-rate. Although it is not rigorously proven that the invention results in minimum-duration pulses, it does produce pulses for which one constraint is always active (except at certain points due to low-pass filtering of the gradient). The minimum duration algorithm takes about 3 s to calculate a 1-msduration excitation with 4-μs sample spacing, using Matlab 6.5 (The Mathworks, Natick, Mass.).

Figure 7:
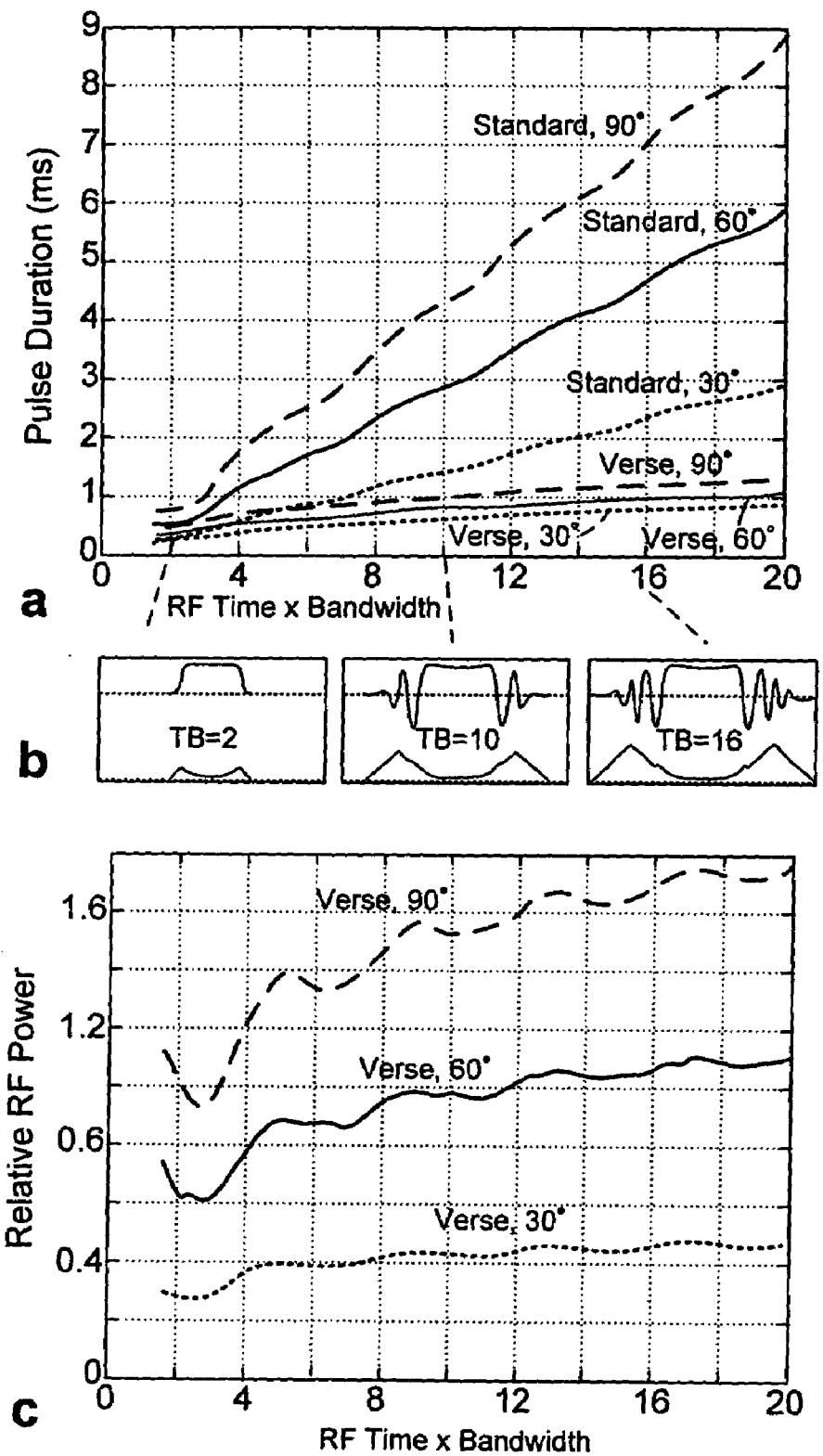
FIGS. 7a–7c. illustrate duration and RF energy versus time-bandwidth of standard and variable rate excitations with different flip angles.

Minimum-time VERSE pulses achieve sharp slab-selective excitation in relatively short amounts of time. Furthermore, the slab sharpness can be further improved with only slight increases in pulse duration, as shown in FIG. 7. As an example with the typical RF and gradient limits used in this study, a 60°, TB=8 VERSE excitation has a duration of 736 μs. This compares to 2400 μs for a standard TB=8 excitation, and 233 μs for a nonselective 60° excitation.

Compared to standard selective excitation pulses, VERSE pulses can be more sensitive to resonant shifts and RF/gradient timing. In minimum-time VERSE pulses, the gradient amplitude is generally larger than that of the standard excitation. The result is that off-resonance performance is not degraded significantly. Our simulations show that resonant shifts of up to 100 Hz result in a 10% increase in the "out-of-slab" or "stop-band" signal; larger shifts are assumed to be absent in balanced SSFP imaging. We have found that RF/gradient misalignments of up to 4 ms do not adversely affect the measured profiles. This tolerance in pulse alignment is easily achieved by tuning during the initial pulse sequence testing.

It is possible that a VERSE excitation would be more sensitive to gradient waveform distortion due to amplifier bandwidth limits or to eddy currents. To mitigate the effects of the former, we smoothed the gradient waveforms used on actual scanners before we applied the VERSE algorithm to generate the RF waveform. If necessary, one could correct for both effects by performing a measurement of the k-space trajectory using, for example, the method proposed by Duyn et al., JMR 1998; 132:150–153. The measured k-space trajectory could then be used in the VERSE algorithm to shape the RF waveform to match the actual gradient waveform.

Figure 8:
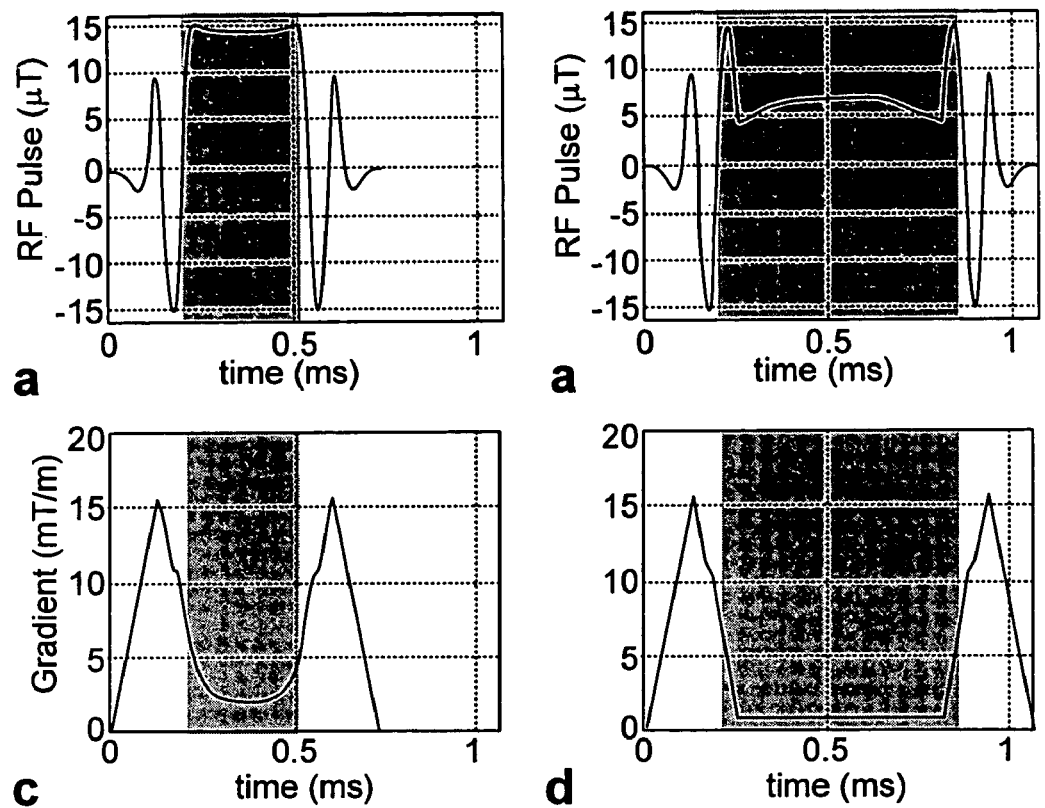
FIG. 8 illustrates a variable rate selective excitation pulse and gradient (8a, 8c) and expanded RF excitation and gradient (8b, 8d) formed by stretching the central lobe of the RF pulse for a reduction of the RF power.

All pulses presented in this work meet the typical SAR limits of 4 W/kg at 1.5 T. At higher flip angles, or at higher field strengths, the RF power of these pulses may become a problem. If SAR limits are exceeded, then the pulse can be distorted to reduce SAR. In particular, since most of the energy of the VERSE pulses is in the central lobe, stretching only the central lobe of the RF pulse will significantly reduce the SAR, without much increase in the pulse duration. An example of this is shown in FIG. 8, where the minimum-time TB=8 VERSE pulse central RF lobe (8a, 8b) and gradient (8c and 8d), is expanded by about a factor of 2. The result is a 45% increase in pulse duration that reduces the RF power to 63% of that of the original pulse. Indeed, it would be possible to include the constraint of maximum RF power in a minimum-time VERSE algorithm with the other three constraints (maximum RF amplitude, maximum gradient amplitude, and maximum gradient slew rate). One could also simply repeat the pulse design changing the maximum RF amplitude, until the SAR limit is also met.

The plots of duration and RF power as a function of TB (FIG. 7) show some ripple that is periodic as TB increases by 4. To explain this ripple, consider that a "sinc"-shaped RF excitation pulse has a central lobe, and approximately TB/2-1 sinc-lobes on each side. As TB increases by 2, an additional sinc lobe is added on each side. However, the added lobes alternate between positive and negative lobes. When negative lobes are added, the total power of the pulse tends to increase rapidly, since the main lobe area must increase to preserve RF pulse area. Conversely, when positive lobes are added, the total power increases more slowly, or even drops.

In the preceding description, we assumed a constant limit of 15 μT for the RF amplitude. However, the maximum RF amplitude is dependent on both the type of transmit coil used and the loading of the coil. In typical MR systems, the maximum RF amplitude is determined during a tuning or prescan procedure with the patient in the scanner. The algorithm we used to design the minimum-time VERSE excitations could be applied after this tuning phase, using the measured maximum RF amplitude. This could allow the use of more optimal excitation pulses for certain coils and patients. Additionally, RF power absorption constraints could be applied at this time in the design. Although this modification is probably unnecessary in most cases, it could result in improved performance with pediatric patients or smaller transmit/receive coils.

The minimum-time VERSE algorithm used herein is particularly useful for cases in which the RF and gradient waveforms are both well below full-scale for much of the duration of the excitation. Although these pulses are more effective for slab-selective excitation than for thin-slice excitation, there will be cases in which the durations can be reduced for thin slices. Additionally, minimum-time VERSE would be useful for shortening the duration of spatially-selective saturation pulses. In multidimensional pulse design, concepts similar to VERSE have been used to reduce excitation duration or RF power.

The combination of VERSE slab excitations with balanced SSFP can have many useful applications. For example, in cardiac or abdominal applications, where patient motion requires rapid scanning, these pulses can enable a reduced FOV in the slab direction. The sharp profiles of these pulses can also benefit balanced-SSFP functional MRI (fMRI) sequences by limiting the FOV to improve temporal resolution. In all of these applications, the use of sharp slab excitations provides advantages similar to those derived from the use of parallel imaging. Parallel imaging requires multiple receivers and a more intricate reconstruction, and is limited by coil geometry. The use of a sharp slab excitation is simpler, and allows a more flexible choice of scan plane. Of course, the two methods could also be combined to achieve even faster scans.

The applications described above focus on the use of minimum-time VERSE excitations for balanced SSFP sequences, where shortening the excitation duration by a fraction of a millisecond can provide substantial improvements. In addition to balanced SSFP sequences, these pulses could be useful in other rapid gradient-spoiled and RF-spoiled sequences, but may offer a relatively minor benefit unless a high TB excitation is used.

As described above, minimum-time VERSE RF pulses allow very sharp slice profiles and reasonably short pulse durations. These pulses are particularly useful for 3D balanced SSFP imaging, where moderately high angles are needed across the whole profile to maintain image contrast. While meeting RF amplitude limits, VERSE pulses allow a factor of 3–4 reduction in duration (to <1 ms) for a very sharp slab profile.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A pulse sequence for use in steady state free precession (SSFP) imaging sequences comprising a RF pulse and a time varying gradient pulse for a selective RF pulse and constant gradient waveform and in which amplitudes of the RF pulse and gradient are increased by compression of the gradient and RF waveforms while pulse time is decreased without exceeding slew rate for the gradient.

2. The pulse sequence as defined by claim 1 wherein end points of the RF and gradient waveforms are zero.

3. The pulse sequence as defined by claim 2 wherein the gradient waveform has two points of maximum amplitude separated by a region of reduced amplitude corresponding to the central portion of the RF pulse waveform.

4. The pulse sequence as defined by claim 3 wherein the region of reduced amplitude is chosen to limit specific absorbed radiation (SAR) in an imaged object.

5. The pulse sequence as defined by claim 4 wherein the region of reduced amplitude of the gradient waveform and the central portion of the RF pulse waveform are increased in width (time) with amplitude reduction in the region of reduced amplitude as necessary to limit SAR.

6. The pulse sequence as defined by claim 5 wherein the pulse and gradient are based on Shinnar-LeRoux (SLR) pulse design algorithm.

7. The pulse sequence as defined by claim 6 wherein amplitude of at least one of the RF pulse and the variable rate gradient reaches maximum amplitude.

8. The pulse sequence as defined by claim 1 wherein an initial RF pulse and time varying gradient are designed based on Shinnar-LeRoux (SLR) pulse design algorithm prior to compression of the gradient and RF waveforms.

9. The pulse sequence as defined by claim 8 wherein amplitude at least one of the RF pulse and the variable rate gradient reaches maximum amplitude.

10. A method of designing a pulse sequence for use in steady state free precession (SSFP) imaging sequences comprising the steps of:
    (a) designing a RF pulse and a constant gradient amplitude pulse,
    (b) compressing the RF pulse and constant amplitude gradient pulse to increase amplitude and decreases time of the pulses without exceeding slew rates for the gradient, and
    (c) setting end points of the gradient and the RF pulse waveforms to zero.

11. The method as defined by claim 10 wherein the compressed gradient and RF waveforms are expanded in time as necessary to avoid slew rate violation.

12. The method as defined by claim 11 wherein after expanding the compressed gradient and RF waveforms, the waveforms are recursively sampled to verify no slew rate violations.

13. The method as defined by claim 12 wherein the compressed gradient pulse has a waveform with two maximum amplitudes separated by a region of reduced amplitude corresponding to the central portion of the RF pulse waveform.

14. The method for claim 12 and further including the step of:
    (d) increasing width (time) of the region of reduce amplitude of the gradient waveform and the central portion of the RF pulse waveform as necessary to limit specific absorbed radiation (SAR) in an imaged object.

15. The method of claim 14 wherein Shinnar-LeRoux (SLR) algorithm is used to design a RF pulse gradient before compressing the RF pulse and gradient.

16. The method of claim 10 wherein the compressed gradient pulse has a waveform with two maximum amplitudes separated by a region of reduced amplitude corresponding to the central portion of the RF pulse waveform.

17. The method of claim 16 including the step of:
    (e) increasing width (time) of the region or reduced amplitude of the gradient waveform and the central portion of the RF pulse waveform to limit SAR.

18. The method of claim 17 wherein the pulse and gradient are based on Shinnar-LeRoux (SLR) algorithm.

19. The method of claim 10 wherein Shinnar-LeRoux (SLR) algorithm is used to design a RF pulse and gradient before compressing the RF pulse and gradient.

* * * * *